United States Patent
Togashi et al.

(10) Patent No.: US 6,704,152 B2
(45) Date of Patent: Mar. 9, 2004

(54) LIGHT IRRADIATING DEVICE, OPTICAL PICKUP DEVICE WITH THE SAME, METHOD OF ADJUSTING LIGHT IRRADIATING DEVICE

(75) Inventors: Mitsuhiro Togashi, Yokohama (JP); Naoki Kaiho, Yokohama (JP); Noriyoshi Takeya, Yokohama (JP); Ichiro Morishita, Yokohama (JP)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 0 days.

(21) Appl. No.: 10/156,102

(22) Filed: May 29, 2002

(65) Prior Publication Data

US 2003/0103276 A1 Jun. 5, 2003

(30) Foreign Application Priority Data

Dec. 5, 2001 (JP) .................................. 2001-371883

(51) Int. Cl.⁷ .................. G02B 7/02; G02B 27/40; G02B 27/30; G11B 7/00
(52) U.S. Cl. .................. 359/823; 359/641; 359/216; 369/44.23; 369/44.32; 250/201.4; 372/38
(58) Field of Search ................ 359/823, 641, 359/216, 218, 204; 369/44.23, 44.32, 44.37, 53.19; 372/38, 25; 250/201.4

(56) References Cited

U.S. PATENT DOCUMENTS

| | | | | | |
|---|---|---|---|---|---|
| 5,276,544 | A | * | 1/1994 | Maeda | 250/201.4 |
| 5,596,445 | A | * | 1/1997 | Ishikawa | 359/216 |
| 5,923,473 | A | * | 7/1999 | Kelley et al. | 359/823 |
| 6,057,953 | A | * | 5/2000 | Ang | 359/216 |
| 6,104,523 | A | * | 8/2000 | Ang | 359/216 |
| 6,108,116 | A | * | 8/2000 | Eskandari | 359/216 |
| 6,317,276 | B1 | * | 11/2001 | Braat | 359/641 |
| 6,363,038 | B1 | * | 3/2002 | Yanagawa | 369/44.32 |

* cited by examiner

*Primary Examiner*—Loha Ben
(74) *Attorney, Agent, or Firm*—Birch, Stewart, Kolasch & Birch, LLP

(57) ABSTRACT

Disclosed herein is a light irradiating device, optical pickup device with the same, and method of adjusting the light irradiating device. The light irradiating device has a light emitting device, a lens system and a secondary lens. The lens system narrows light emitted from the light emitting device to a predetermined diameter. The secondary lens is disposed between the light emitting device and the lens system. Each of the light emitting device and the secondary lens is fixed to an arbitrary position on the optical axis while allowing the light emitting device and the secondary lens to move independently along an optical axis. According to the present invention, the light irradiating device can obtain light use efficiency and a uniform light intensity distribution required for recording/reproducing of an optical information recording medium.

16 Claims, 8 Drawing Sheets

LIGHT IRRADIATING DEVICE, OPTICAL PICKUP DEVICE WITH THE SAME, METHOD OF ADJUSTING LIGHT IRRADIATING DEVICE

BACKGROUND OF THE INVENTION

1. Field of the Invention

The present invention relates generally to a light irradiating device, optical pickup device with the same, and method of adjusting the light irradiating device, which is suitably used in various recording apparatuses having a function of recording information in optical information recording media, such as digital versatile discs, etc.

2. Description of the Prior Art

Recently, there has been realized a digital versatile disc (DVD) that allows an image quality higher than that of a laser disc and a running time longer than 130 minutes on a single side. Such a DVD has a capacity of about 4.7 GB on a single side, which is seven times greater than that of a compact disc-read only memory (CD-ROM).

For recording/reproducing of an optical information recording medium such as the optical disc, an optical pickup device is used having the construction in which optical devices such as a semiconductor laser (LD: light emitting device), a polarization beam splitter, a collimating lens, a ¼λ plate, an object lens and a PIN-photo diode (PIN-PD: light receiving device) are arranged along an optical axis.

The optical pickup device narrows light emitted from the semiconductor laser to a predetermined diameter by the collimating lens and the object lens, and then condenses the narrowed light onto an optical information recording medium. In this case, in order to maximally increase energy of a light spot condensed onto the optical recording medium, the light emitted from the semiconductor laser must be used as efficiently as possible, and a numerical aperture (NA) of the collimating lens must be set to as large as possible.

However, on a plane perpendicular to an optical axis of light emitted from the semiconductor laser, a light intensity distribution is represented by a Gaussian distribution in which light intensity is high at its center, and becomes rapidly lower from the center to the sides. Therefore, parallel light obtained by converting the emitted light using the collimating lens, or diffused light with a predetermined radiation angle, also has the same light intensity distribution as the Gaussian distribution. In this case, since the size of the spot of light condensed onto the optical information recording medium by the object lens is increased, various problems such as a decreased recording density of the optical information recording medium, a deterioration of reproduced signals, etc., may occur.

Therefore, in order to solve the above problems, an optical pickup device using a beam shaping prism is proposed and provided practically.

FIG. 12 is a view showing the construction of a conventional optical pickup device using a beam shaping prism. Referring to FIG. 12, reference numeral 1 designates a semiconductor laser (LD: light emitting device), reference numeral 2 a collimating lens, reference numeral 3 a beam shaping prism in which a pair of prisms 3a and 3b are arranged facing each other, reference numeral 4 an object lens, and reference numeral 5 an optical disc (optical information recording medium).

The semiconductor laser 1 emits light, for example, blue light having a wavelength of 430 nm, or red light having a wavelength of 635 nm. A radial diffusion angle of the emitted light has radiation properties different in the horizontal and vertical directions with respect to a plane of polarization. For example, a diffusion angle in a vertical direction is about 30 to 40 degrees, and a diffusion angle in a horizontal direction is about 10 degrees.

In the optical pickup device, light radially emitted from the semiconductor laser 1 is converted into parallel light by the collimating lens 2. Intensity distribution of light sequentially transmitted through and diffracted by the respective prisms 3a and 3b constituting the beam shaping prism 3 is converted from the Gaussian distribution to a flat distribution. Then, the transmitted and diffracted light is narrowed to a predetermined diameter by the object lens 4, such that it is condensed onto a recording surface of the optical disc 5.

Light reflected from the recording surface of the optical disc 5 is converted into parallel light by the object lens 4, sequentially transmitted through the beam shaping prism 3 and the collimating lens 2, and then received by the PIN-PD (light receiving device) via an optical system such as a polarizing beam splitter (not shown). The received light can be obtained as reproduced signals.

FIG. 13 is a graph showing light intensity distributions before and after light is transmitted through the beam shaping prism 3. In the graph, a curve A is a light intensity distribution before light is transmitted through the beam shaping prism 3, and a curve B is a light intensity distribution after light is transmitted through the beam shaping prism 3.

Referring to FIG. 13, the light intensity distribution A before light is transmitted through the beam shaping prism 3 is a Gaussian distribution. However, as light is transmitted through and refracted by the beam shaping prism 3, the light intensity distribution is converted into the light intensity distribution B, in which the light intensity is lower in its center than that of the Gaussian distribution, and becomes gradually lower from the center to the sides, that is, flatter than the Gaussian distribution.

As described above, the light emitted from the semiconductor laser 1 has the light intensity distribution B flatter than the Gaussian distribution over the entire range of a valid diameter Dc of the collimating lens 2 by the transmission of light through the beam shaping prism 3. Therefore, if the recording density of an optical information recording medium is decreased, there is a little concern about deterioration of reproduced signals, or other problems.

Meanwhile, in the conventional optical pickup device using a beam shaping prism, the beam shaping prism 3 is constructed such that the pair of prisms 3a and 3b are arranged facing each other. Therefore, an optical axis is apt to be refracted and be eccentric, so it is difficult to adjust the assembly of the optical pickup device using a beam shaping prism. Further, the conventional optical pickup device is problematic in that it employs the pair of prisms 3a and 3b, so it is difficult to miniaturize the optical pickup device. Further, the conventional optical pickup device is problematic in that the number of optical parts is increased, thus causing the manufacturing process of the optical pickup device to be lengthened, and increasing manufacturing costs thereof.

Moreover, the conventional optical pickup device using a beam shaping prism is problematic in that astigmatism occurs if light transmitted through and refracted by the beam shaping prism 3 is not parallel light.

Further, a light emission wavelength of emitted light can be adjusted within ±5 nm of a desired wavelength by the semiconductor laser 1, while deviation of a radiation angle of the emitted light cannot be adjusted.

SUMMARY OF THE INVENTION

Accordingly, the present invention has been made keeping in mind the above problems occurring in the prior art, and an object of the present invention is to provide a light irradiating device, optical pickup device with the same, and method of adjusting the light irradiating device, which can obtain light use efficiency required for recording/reproducing of an optical information recording medium, achieve a uniform light intensity distribution in a plane perpendicular to an optical axis, prevent refraction and eccentricity of the optical axis, simplify assembly and adjustment of the light irradiating device, minimize generation of astigmatism, and adjust deviation of a radiation angle of light emitted from a semiconductor laser.

In order to accomplish the above object, the present invention provides a light irradiating device, optical pickup device with the same, and method of adjusting the light irradiating device.

In accordance with a first aspect of the present invention, the present invention can be accomplished by the provision of a light irradiating device, comprising a light emitting device; a lens system for narrowing light emitted from the light emitting device to a predetermined diameter; and a secondary lens disposed between the light emitting device and the lens system; wherein each of the light emitting device and the secondary lens is fixed to an arbitrary position on an optical axis while allowing the light emitting device and the secondary lens to move independently along the optical axis.

In the light irradiating device, a secondary lens is disposed between the light emitting device and the lens system, thus allowing the composite focal distance of the lens system and the secondary lens to be a practical focal distance of the lens system.

The light emitting device and the secondary lens can each be independently moved along the optical axis to be fixed to an arbitrary portion on the optical axis, such that a lens system having a variable focal distance can be realized by moving the secondary lens along the optical axis on the optical axis between the light emitting device and the lens system.

In this case, if the radiation angle of light emitted from the light emitting device is less than a standard value, the numerical aperture (NA) of the lens system is reduced by increasing the focal distance of the lens system. Herewith, the center part of the light intensity distribution of the emitted light is used, thus realizing the uniformity of the light intensity distribution.

Further, if the radiation angle of light emitted from the light emitting device is higher than the standard value, the uniformity of the light intensity distribution of the emitted light can be maintained; however, use efficiency of the light intensity distribution of the emitted light is decreased. In this case, the numerical aperture (NA) of the lens system can be increased and use efficiency of the light intensity can be maintained at the standard value by reducing the focal distance of the lens system.

As described above, the light irradiating device can obtain light use efficiency and a uniform light intensity distribution required for recording/reproducing of an optical information recording medium.

Further, the light irradiating device can prevent refraction and eccentricity of the optical axis, and simplify its assembly and adjustment. Further, the light irradiating device can minimize generation of astigmatism, and adjust the deviation of a radiation angle of light emitted from the light emitting device.

In accordance with a second aspect of the present invention, a light irradiating device is provided having the above construction, wherein the lens system includes a collimating lens for converting the light emitted from the light emitting device into parallel light, and an object lens for narrowing the parallel light from the collimating lens to a predetermined diameter; and the collimating lens is fixed to an arbitrary position on the optical axis while allowing the collimating lens to move along the optical axis.

In the light irradiating device, the lens system has a collimating lens for converting the light emitted from the light emitting device into parallel light, and an object lens for narrowing the parallel light from the collimating lens to a predetermined diameter, wherein the collimating lens can be fixed to an arbitrary position on the optical axis by moving the collimating lens along the optical axis, thus obtaining light use efficiency and a uniform light intensity distribution required for recording/reproducing of an optical information recording medium, in an infinite optical system.

In accordance with a third aspect of the present invention, a light irradiating device is provided having the above construction of the first or second aspects of the present invention, and further comprising a housing for accommodating the light emitting device and the lens system therein, the housing having one or more holes formed in its side surfaces for detecting a position of the light emitting device or the lens system, or positions of both the light emitting device and lens system.

In the light irradiating device, one or more holes to detect the position of the light emitting device or the lens system, or positions of both the light emitting device and lense system, are formed in side surfaces of a housing which accommodates the light emitting device and the lens system, thereby enabling the positioning of the light emitting device or the lens system, or both the light emitting device and lens system, to be easily carried out in a short period of time.

In accordance with a fourth aspect of the present invention, a light irradiating device is provided having the above construction of the first, second or third aspects of the present invention, wherein at least one of the light emitting device and the lens system has a discerning mark formed thereon.

In the light irradiating device, a discerning mark is formed on the light emitting device or the lens system, or both of them, thus enabling the light emitting device or the lens system, or both of them, to be easily discerned, and improving working efficiency in their positioning operations.

In accordance with a fifth aspect of the present invention, an optical pickup device is provided comprising a light irradiating device in accordance with any of the first to fourth aspects of the present invention.

The optical pickup device can emit light having a light use efficiency and a uniform light intensity distribution required for recording/reproducing of an optical information recording medium to the optical information recording medium.

Further, the optical pickup device can prevent refraction and eccentricity of the optical axis, and simplify its assembly and adjustment. Further, the light irradiating device can minimize generation of astigmatism, and adjust the deviation of a radiation angle of light emitted from the light emitting device.

In accordance with a sixth aspect of the present invention, a method of adjusting a light irradiating device is provided, the light irradiating device having a light emitting device, a lens system for narrowing light emitted from the light emitting device to a predetermined diameter, and a secondary lens disposed between the lens system and the light emitting device, comprising the steps of varying a composite focal distance of the lens system and the secondary lens by moving the secondary lens along an optical axis; and moving the light emitting device along the optical axis, and allowing a light emitting point of the light emitting device to correspond to a composite focus of the lens system and the secondary lens.

The method of adjusting a light irradiating device can enable emission of light having a light use efficiency and a uniform light intensity distribution required for recording/reproducing of an optical information recording medium by varying a composite focal distance of the lens system and the secondary lens by moving the secondary lens along an optical axis and moving the light emitting device along the optical axis, and allowing a light emitting point of the light emitting device to correspond to a composite focus of the lens system and the secondary lens. Further, the secondary lens and the light emitting device can be moved along the optical axis, thus enabling the light irradiating device to be easily assembled and adjusted, and removing difficulty of assembly and adjustment of a conventional light irradiating device.

In accordance with a seventh aspect of the present invention, a method of adjusting a light irradiating device is provided, the light irradiating device having a light emitting device, a collimating lens for converting light emitted from the light emitting device into parallel light, an object lens for narrowing the parallel light from the collimating lens to a predetermined diameter and a secondary lens disposed between the collimating lens and the light emitting device, comprising the step of varying a composite focal distance of the collimating lens and the secondary lens by moving the collimating lens and the secondary lens independently along an optical axis, thus allowing the position of a composite focus of the collimating lens and the secondary lens to correspond to a light emitting point of the light emitting device.

The method of adjusting a light irradiating device can enable emission of light having a light use efficiency and a uniform light intensity distribution required for recording/reproducing of an optical information recording medium by varying a composite focal distance of the collimating lens and the secondary lens by moving the collimating lens and the secondary lens independently along an optical axis, thus allowing the position of a composite focus of the collimating lens and the secondary lens to correspond to a light emitting point of the light emitting device. Further, the collimating lens and the secondary lens can be moved along the optical axis, thus enabling the light irradiating device to be easily assembled and adjusted, and removing difficulty of assembly and adjustment of a conventional light irradiating device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Hereinafter, a light irradiating device, an optical pickup device with the same, and a method of adjusting the light irradiating device according to preferred embodiments of the present invention will be described in detail with reference to the attached drawings.

Figure 1:
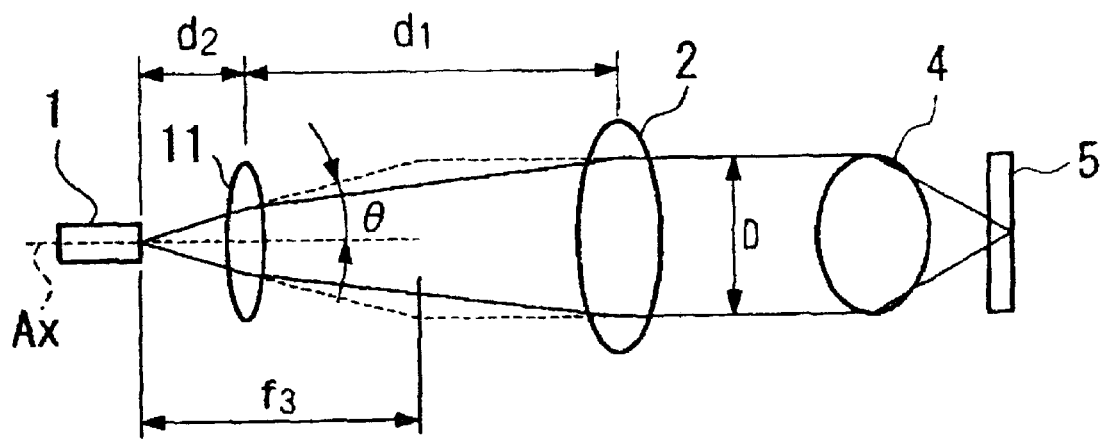
FIG. 1 is a view showing the construction of a light irradiating device according to a first preferred embodiment of the present invention.
Figure 12:
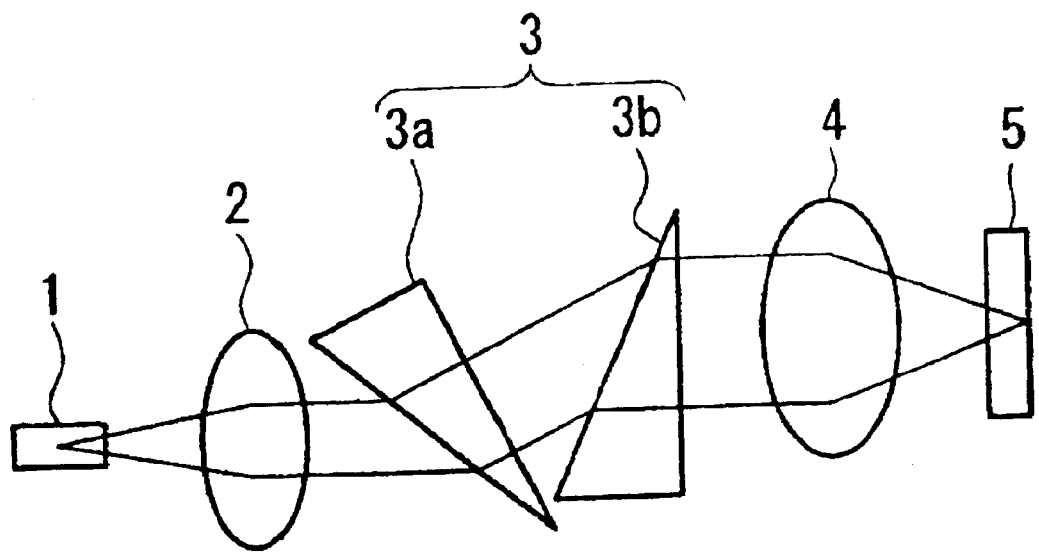
FIG. 12 is a view showing the construction of a conventional optical pickup device using a beam shaping prism.
Figure 13:
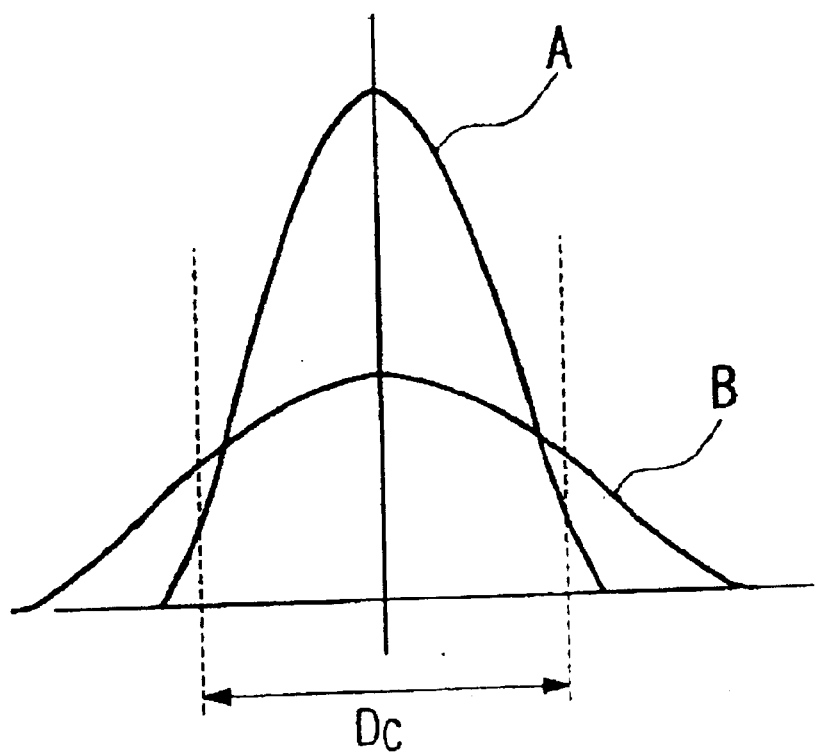
FIG. 13 is a graph showing light intensity distributions before and after light is transmitted through the beam shaping prism in the conventional optical pickup device of FIG. 12.

FIG. 1 is a view showing the construction of a light irradiating device according to a first preferred embodiment of the present invention. The light irradiating device is a device of an infinite optical system, using a collimating lens. Further, the same reference numerals as those of FIG. 12 are used in FIG. 1 to designate the same or similar components, and descriptions of the same components are omitted.

Referring to FIG. 1, reference numeral 11 is a relay lens (secondary lens) disposed between a semiconductor laser 1 and a collimating lens 2.

In the light irradiating device, the collimating lens 2 and an object lens 4 are fixed to a housing. Further, the semiconductor laser 1 and the relay lens 11 can be each fixed to an arbitrary position on an optical axis Ax while independently moving along the optical axis Ax. A collimating lens structure is constructed by both the collimating lens 2 and the relay lens 11. The focal distance of the collimating lens system corresponds to a composite focal distance $f_3$ of the collimating lens 2 and the relay lens 11.

In this case, it is assumed that a focal distance of the collimating lens 2 is $f_1$, a focal distance of the relay lens 11 is $f_2$, a distance between the collimating lens 2 and the relay lens 11 is $d_1$, a distance between the relay lens 11 and the semiconductor laser 1 is $d_2$, a valid diameter of the object lens 4 is D, and a range of a radiation angle, to which the collimating lens system can be introduced, of radiation angles of laser light (emitted light) from the semiconductor laser 1, is θ.

The focal distance of the collimating lens system, that is, the composite focal distance $f_3$ of the collimating lens 2 and the relay lens 11, can be expressed by the following Equation.

$$f_3 = f_1 \cdot f_2 / (f_1 - f_2 - d_1) \qquad [1]$$

According to Equation [1], if the distance $d_1$ between the collimating lens 2 and the relay lens 11 is shortened, the composite focal distance $f_3$ is also shortened, while if the distance $d_1$ between the collimating lens 2 and the relay lens 11 is lengthened, the composite focal distance $f_3$ is also lengthened.

Therefore, the composite focal distance $f_3$ of the collimating lens 2 and the relay lens 11 can be freely changed by only moving the relay lens 11 along the optical axis Ax.

Further, the distance $d_2$ between the relay lens 11 and the semiconductor laser 1 is set such that a light emitting point of the semiconductor laser 1 corresponds to the composite focal distance $f_3$ of the collimating lens 2 and the relay lens 11 on the side of the semiconductor laser 1. In fact, there is employed a method of allowing the light emitting point of the semiconductor laser 1 to correspond to the composite focal distance $f_3$ of the collimating lens 2 and the relay lens 11 on the side of the semiconductor laser 1 by moving the semiconductor laser 1 along the optical axis Ax.

Then, the range θ of a radiation angle, to which the collimating lens system can be introduced, can be changed by varying the composite focal distance $f_3$ of the collimating lens 2 and the relay lens 11, which is described in detail with reference to FIGS. 2 and 3.

Figure 2:
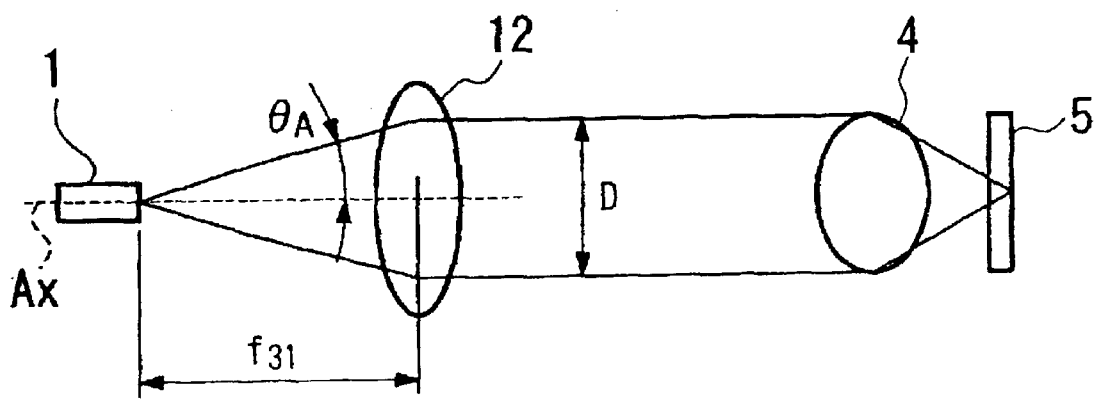
FIG. 2 is a view showing the range of a radiation angle if a composite focal distance of the light irradiating device of FIG. 1 is short.
Figure 3:
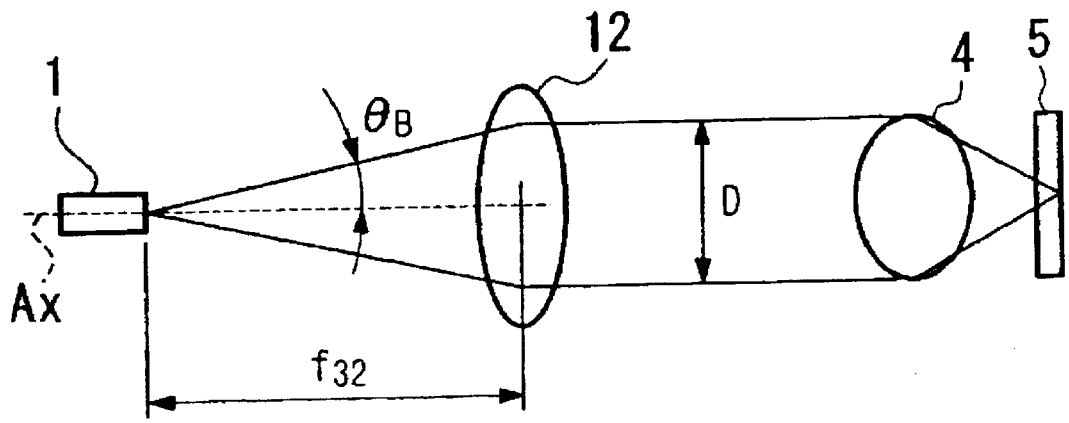
FIG. 3 is a view showing the range of a radiation angle if a composite focal distance of the light irradiating device of FIG. 1 is long.

Further, for simplicity of description in FIGS. 2 and 3, the collimating lens 2 and the relay lens 11 are not shown individually, but a single virtual lens 12 having a focal distance $f_{31}$ or $f_{32}$ is substituted for the collimating lens system.

FIG. 2 is a view showing the range of a radiation angle if the composite focal distance is short, and FIG. 3 is a view showing the range of a radiation angle if the composite focal distance is long.

It is assumed that if the composite focal distance is short, the range of the radiation angle, to which the collimating lens system can be introduced, is $θ_A$, while if the composite focal distance is long, the range of the radiation angle, to which the collimating lens system can be introduced, is $θ_B$. At this time, the focal distance $f_{31}$ of the single lens 12 is set to be shorter than the focal distance $f_{32}$. Further, the position of the light emitting point of the semiconductor laser 1 is set to correspond to the focal distances $f_{31}$ and $f_{32}$ at a side of the semiconductor laser 1 in FIGS. 2 and 3, respectively.

Referring to FIGS. 2 and 3, provided that a valid diameter of laser light which is refracted by and transmitted through the collimating lens 2 is always equal to the valid diameter D of the object lens 4, $θ_A > θ_B$ is always satisfied when $f_{31} < f_{32}$.

Therefore, it is clear that if the composite focal distance $f_3$ of the collimating lens 2 and the relay lens 11, that is, the focal distance of the single virtual lens 12, is lengthened, the range of the radiation angle, to which the collimating lens system can be introduced, is narrowed. On the contrary, it is also clear that if the focal distance of the single virtual lens 12 is shortened, the range of the radiation angle, to which the collimating lens system can be introduced, is widened.

A method of uniformly maintaining the light intensity distribution of laser light transmitted through the collimating lens 2 will now be described.

In this method, if the radiation angle of laser light emitted from the semiconductor laser 1 is small, and the light intensity distribution of the laser light is represented by a Gaussian distribution in which the light intensity is high at its center and rapidly decreased from the center to the sides, the light intensity distribution of laser light is allowed to be uniform and flatter than the Gaussian distribution by lengthening the focal distance of the collimating lens system.

Figure 4:
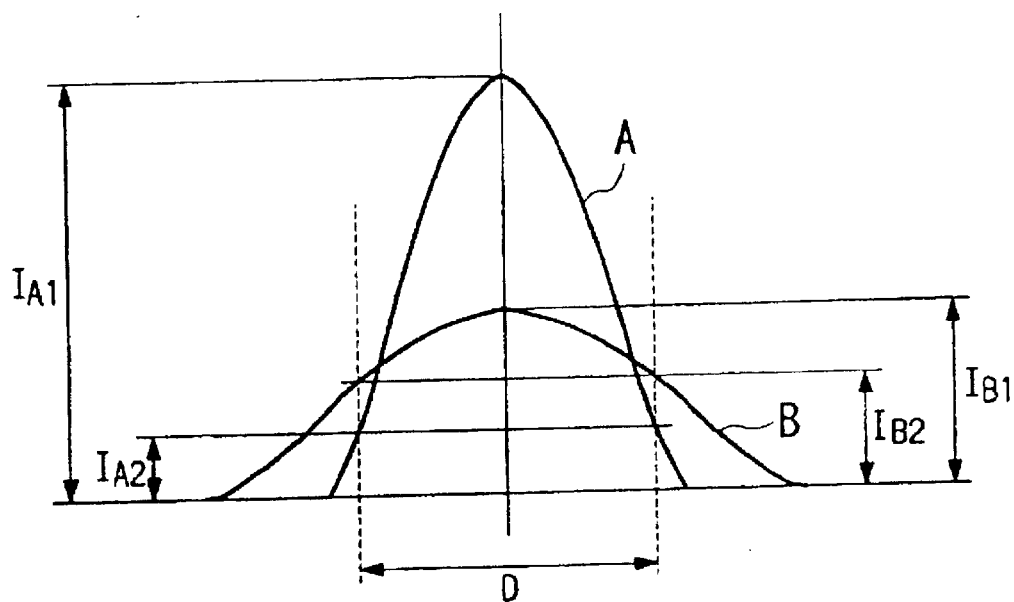
FIG. 4 is a graph showing a light intensity distribution of laser light after the laser light is transmitted through a collimating lens of the light irradiating device of FIG. 1.

FIG. 4 is a graph showing the light intensity distribution of laser light after the laser light is transmitted through the collimating lens. A curve A is a light intensity distribution of laser-light if the composite focal distance of the collimating lens system is $f_{31}$, and a curve B is a light intensity distribution of laser light if the composite focal distance of the collimating lens system is $f_{32}$.

Further, $I_{A1}$ is a central light intensity of laser light if the composite focal distance of the collimating lens system is $f_{31}$, and $I_{A2}$ is a rim (circumferential portion) light intensity of laser light if the composite focal distance of the collimating lens system is $f_{31}$. Further, $I_{B1}$ is a central light intensity of laser light if the composite focal distance of the collimating lens system is $f_{32}$, and $I_{B2}$ is a rim light intensity of laser light if the composite focal distance of the collimating lens system is $f_{32}$.

Referring to FIG. 4, if the composite focal distance of the collimating lens system is $f_{31}$, the light intensity distribution of laser light is represented by a Gaussian distribution in which light intensity is high at the center, and becomes rapidly lower from the center to the sides. However, if the composite focal distance of the collimating lens system is $f_{32}$, since $f_{31} < f_{32}$, the light intensity distribution of laser light is represented by a Gaussian distribution in which light intensity is lower at the center than that of the composite focal distance $f_{31}$, and becomes gradually lower from the center to the sides. Therefore, the light intensity distribution represents a flat light intensity distribution.

Referring to FIGS. 2 to 4, it is clear that the range of the radiation angle θ of laser light, to which the collimating lens system can be introduced, is narrow when the composite focal distance is $f_{32}$, compared with when the composite focal distance is $f_{31}$. Therefore, the uniformity of the light intensity can be realized by only using the center of the laser light intensity distribution having a Gaussian distribution.

Further, if the ratio of rim light intensity to center light intensity (rim light intensity/center light intensity) is defined as a rim intensity ratio, the light intensity distribution is regarded as uniform when the rim intensity ratio approaches "1". With reference to FIG. 4, if the rim intensity ratio is obtained, $I_{A2}/I_{A1} < I_{B2}/I_{B1}$ is definitely satisfied, so it is clear that the light intensity becomes uniform.

However, for the semiconductor laser 1, deviation occurs in the radiation angle of laser light due to variations of its construction and its manufacturing process. For example, contrary to FIG. 4, deviation of the radiation angle may occur even if the radiation angle of laser light emitted from the semiconductor laser is large.

In this case, since the rim intensity ratio approaches "1", the uniformity of the light intensity distribution is satisfied. However, as shown in FIG. 4, parts which exceed the valid diameter D of the object lens are increased, thus decreasing the laser light use efficiency.

In order to obtain a laser light use efficiency and a light intensity distribution (rim intensity ratio) necessary for recording/reproducing of an optical information recording medium, it is required to appropriately select the focal distance of the collimating lens system, that is, the composite focal distance of the collimating lens 2 and the relay lens 11, with respect to the radiation angle of unique laser light of the semiconductor laser 1, and the position of the semiconductor laser 1 with respect to the focal distance.

A method of appropriately selecting the focal distance of the collimating lens with respect to the radiation angle of unique laser light of the semiconductor laser 1 will now be described using a width $\Theta$ of the radiation angle.

Figure 5:
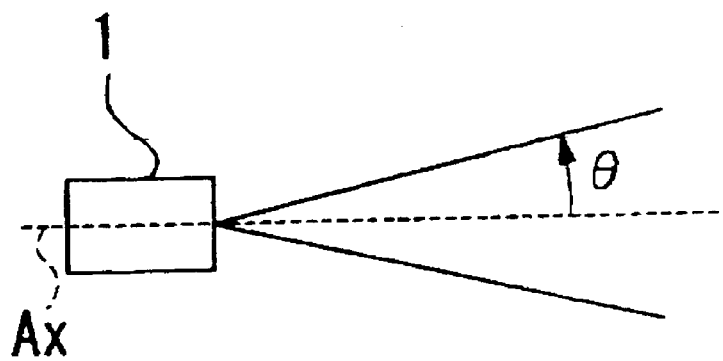
FIG. 5 is a view showing a radiation angle of laser light emitted from a semiconductor laser.
Figure 6:
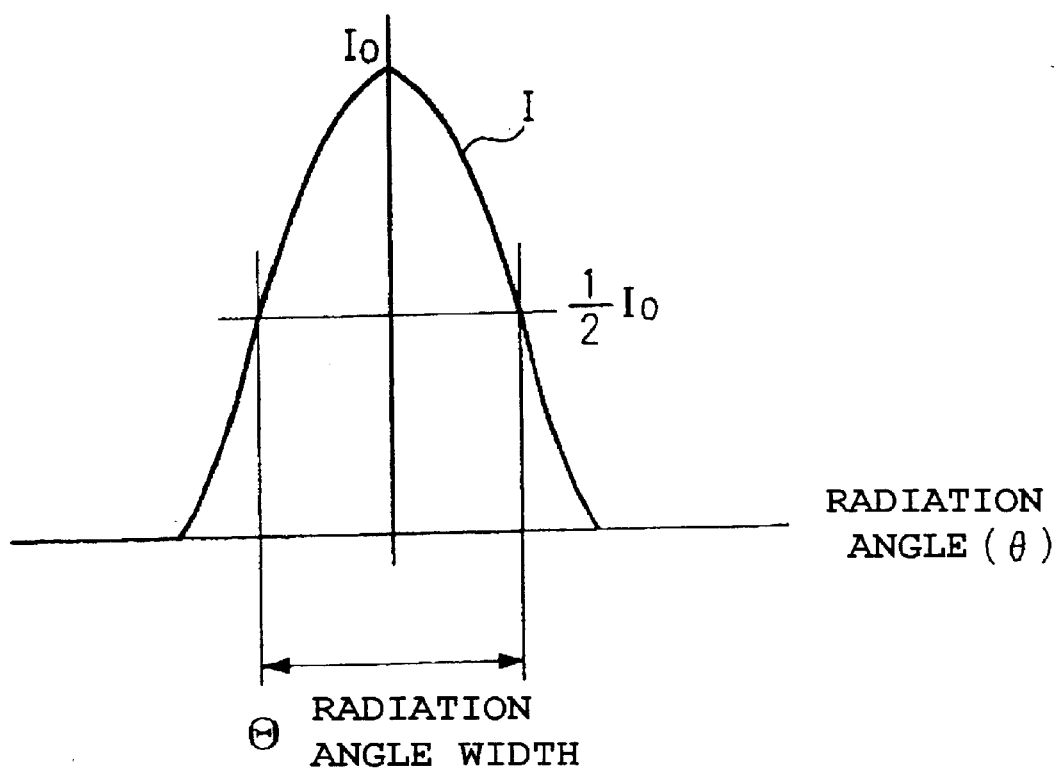
FIG. 6 is a graph showing a radiation angle of laser light emitted from the semiconductor laser.

In this case, as shown in FIGS. 5 and 6, it is assumed that the radiation angle of unique laser light emitted from the semiconductor laser 1 is $\theta$, and the radiation angle width $\Theta$ is a width of the radiation angle $\theta$, corresponding to 50% of maximum intensity $I_0$ ($I_0/2$: half of maximum intensity) of the light intensity distribution I of the laser light.

Figure 7:
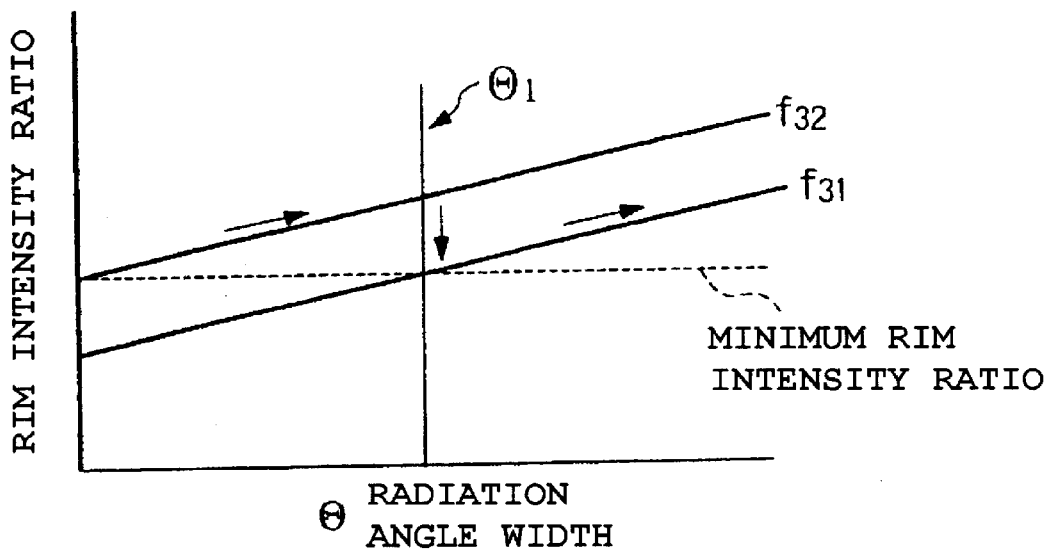
FIG. 7 is a graph showing a relationship between a width of a radiation angle of laser light and a rim intensity ratio.
Figure 8:
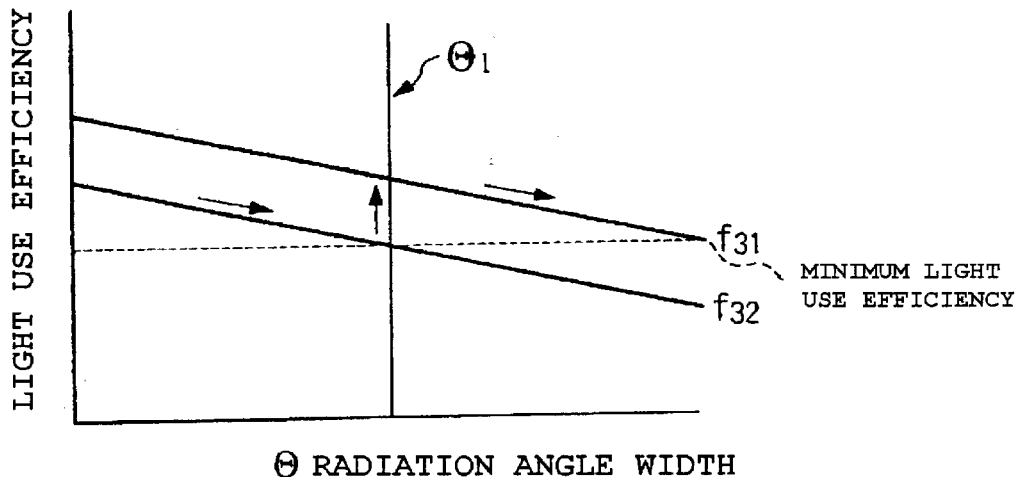
FIG. 8 is a graph showing a relationship between a width of a radiation angle of laser light and light use efficiency.

FIG. 7 is a graph showing a relationship between the radiation angle width $\Theta$ of laser light and the rim intensity ratio, and FIG. 8 is a graph showing a relationship between the radiation angle width $\Theta$ of laser light and light use efficiency. In this case, focal distances $f_{31}$ and $f_{32}$ of the collimating lens system are set to parameters. Further, it is assumed that $f_{31}<f_{32}$ is always satisfied.

Here, in order to obtain a minimum rim intensity ratio required for recording/reproducing of optical information, it is required to use rim intensity ratio values over the minimum rim intensity ratio of FIG. 7. Therefore, if the radiation angle width $\Theta$ of laser light is equal to or less than $\Theta_1$, the focal distance of the collimating lens system must be set to $f_{32}$. Further, if the radiation angle width $\Theta$ of laser light is greater than $\Theta_1$, the focal distance of the collimating lens system can be set to any of $f_{31}$ and $f_{32}$.

Further, in order to obtain a minimum light use efficiency required for recording/reproducing of optical information, it is required to use light use efficiency values over the minimum light use efficiency of FIG. 8. Therefore, if the radiation angle width $\Theta$ of laser light is greater than $\Theta_1$, the focal distance of the collimating lens system must be set to $f_{31}$. Further, if the radiation angle width $\Theta$ of laser light is equal to or less than $\Theta_1$, the focal distance of the collimating lens system can be set to any of $f_{31}$ and $f_{32}$.

As described above, there is a trade-off in the relationship between the rim intensity ratio of laser light and the light use efficiency. Accordingly, in order to satisfy both the rim intensity ratio of laser light and the light use efficiency required for recording/reproducing of optical information, if the radiation angle width $\Theta$ of laser light is equal to or less than $\Theta_1$, the focal distance of the collimating lens system is preferably set to $f_{32}$, while if the radiation angle width $\Theta$ is greater than $\Theta_1$, the focal distance of the collimating lens system is preferably set to $f_{31}$.

As described above, in the light irradiating device according to the preferred embodiment of the present invention, the relay lens 11 is disposed between the semiconductor laser 1 and the collimating lens 2. Further, the semiconductor laser 1 and the relay lens 11 can be independently fixed to arbitrary positions on the optical axis Ax. Therefore, the present invention can use center parts of the light intensity distribution of laser light and realize the uniformity of the light intensity distribution, such that it can obtain a light use efficiency and a uniform light intensity distribution required for recording/reproducing of the optical disc 5.

Further, the light irradiation device of the present invention can prevent refraction and eccentricity of the optical axis, and allow its assembly and adjustment to be easily performed. Further, the light irradiating device can minimize generation of astigmatism, and adjust a deviation of the radiation angle of laser light.

A method of adjusting the light irradiating device according to the preferred embodiment of the present invention can enable emission of laser light having a light use efficiency and a uniform light intensity distribution which are required for recording/reproducing of optical discs. Further, the method of adjusting the light irradiating device can allow its assembly and adjustment to be easily carried out and reduce difficulty of adjustment generated in the conventional light irradiating device, by moving the relay lens 11 and the semiconductor laser 1 along the optical axis.

Figure 9:
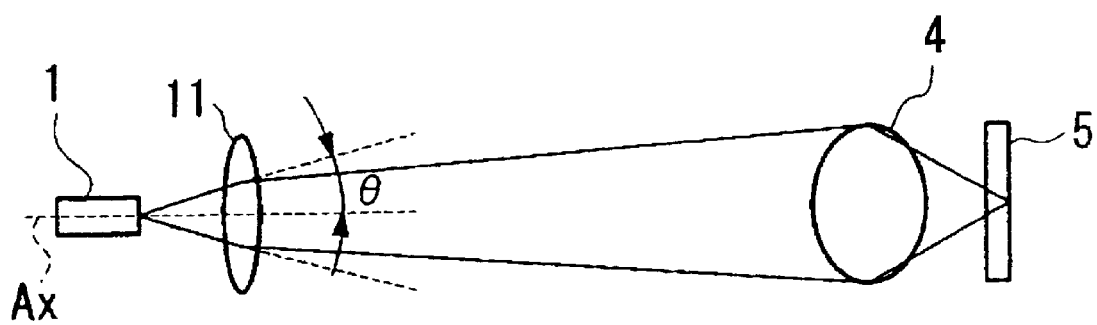
FIG. 9 is a view showing the construction of a light irradiating device according to a second preferred embodiment of the present invention.

FIG. 9 is a view showing the construction of a light irradiating device according to a second preferred embodiment of the present invention. The light irradiating device of the second embodiment of FIG. 9 is different from that of the first embodiment of FIG. 1 in that it does not use the collimating lens 2 and is a light irradiating device of a finite optical system.

The light irradiating device of the second embodiment of the present invention can obtain the same effect as that of the first embodiment of the present invention.

Figure 10:
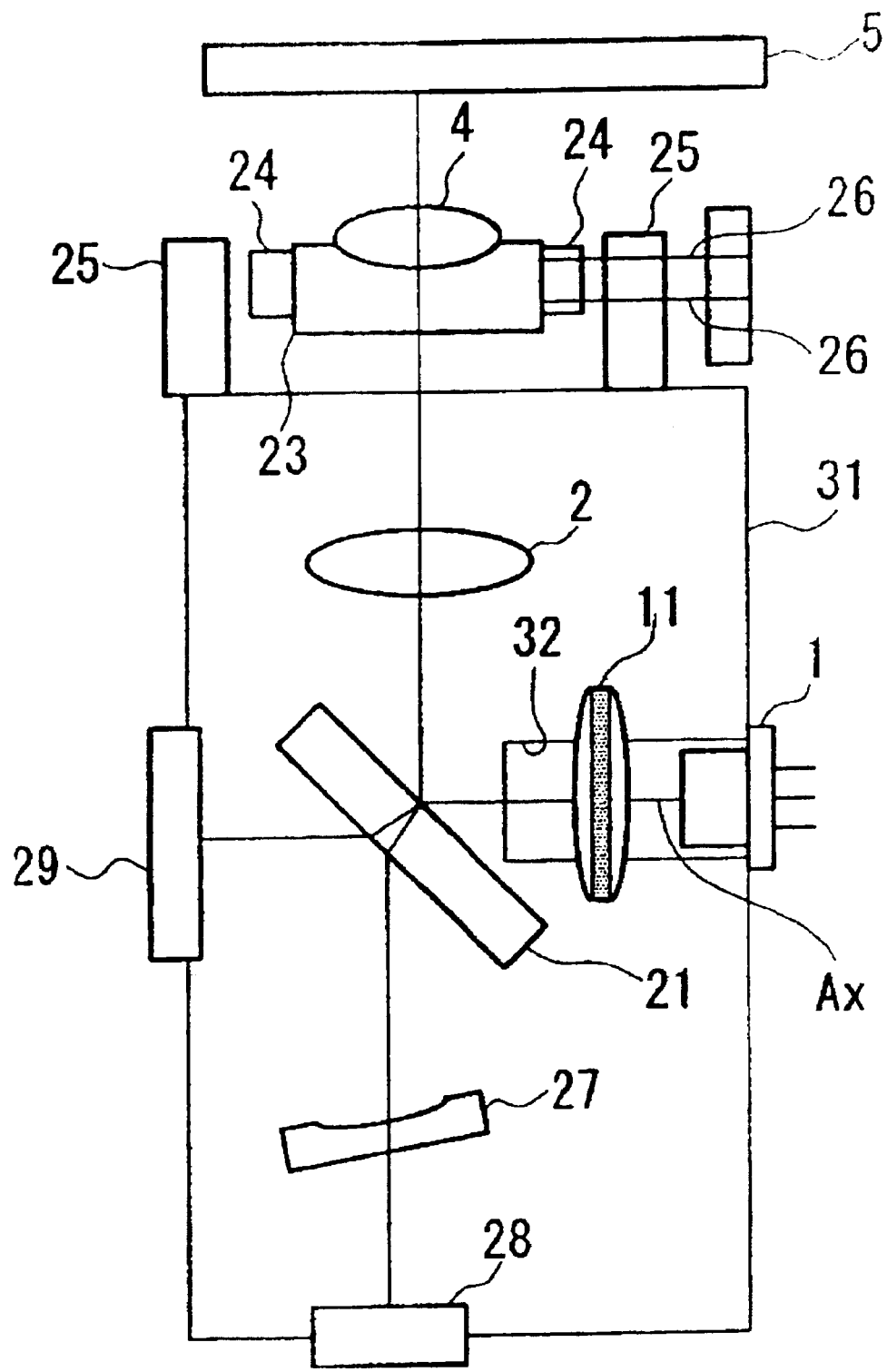
FIG. 10 is a view showing the construction of an optical pickup device according to a preferred embodiment of the present invention.
Figure 11A:
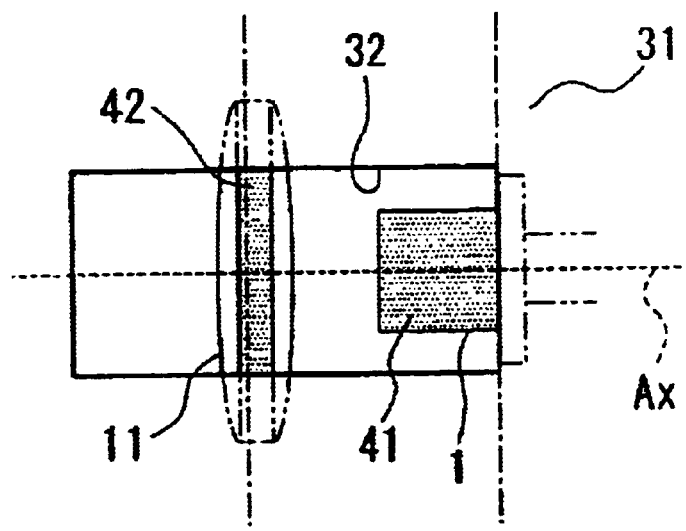
FIGS. 11a and 11b are side views showing important parts of the optical pickup device of FIG. 10.
Figure 11B:
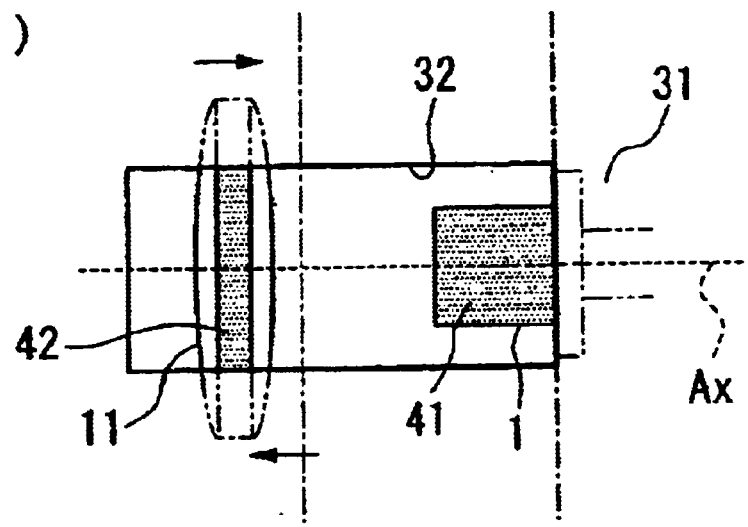

FIG. 10 is a view showing the construction of an optical pickup device according to a preferred embodiment of the present invention, and FIGS. 11a and 11b are side views showing important parts of the optical pickup device of FIG. 10. In this case, the optical pickup device is a device of an infinite optical system, using the light irradiating device according to the first embodiment of the present invention. Further, the same reference numerals as those of FIG. 1 are used in FIG. 10 to designate the same or similar components, and descriptions of the same components are omitted.

Referring to FIGS. 10, 11a, and 11b reference numeral 21 designates a beam splitter, reference numeral 23 a lens holder, reference numeral 24 a moving magnet, reference numeral 25 a coil, reference numeral 26 a wire, reference numeral 27 a sensor lens, reference numeral 28 a photo diode (PD: light receiving device), reference numeral 31 a housing accommodating an optical system, and reference numeral 32 holes formed in both side surfaces of the housing 31.

The holes 32 are rectangular openings to detect and check the positions of the semiconductor laser 1 and the relay lens 11, and are formed to be opposite to each other through both side surfaces of the housing 31 with the optical axis Ax of the semiconductor laser 1 and the relay lens 11 disposed therebetween.

One of the opposite holes 32 is shown in FIG. 10, while the other is shown in FIGS. 11a and 11b.

Further, in order to discern the position of the semiconductor laser 1 from the outside, a color 41 different from that of a casing of the semiconductor laser 1 is applied on the circumferential surface of a light emitting part of the semiconductor laser 1. Similarly, in order to discern the position of the relay lens 11 from the outside, a color 42 different from the color 41 of the semiconductor laser 1 is applied on the circumferential surface of the relay lens 11.

The optical pickup device can detect and check respective positions of the semiconductor laser 1 and the relay lens 11 by irradiating light from the hole 32 of FIGS. 11a and 11b and detecting the existence of corresponding light by the hole 32 of FIG. 10.

For example, as shown in FIG. 11b, if the relay lens 11 is deviated from a desired position, light irradiated toward the relay lens 11 is not blocked by the relay lens 11, but is transmitted and detected. In this case, if the blocking of light irradiated toward the relay lens 11 which moves along the optical axis Ax is detected, it can be checked that the relay lens 11 moves to a desired position.

As described above, the optical pickup device of the present invention can allow the positioning of the semiconductor laser 1 and the relay lens 11 to be easily carried out in a short period of time, by forming the holes 32 in both side surfaces of the housing 31 which accommodates the optical system so as to detect and check the positions of the semiconductor laser 1 and the relay lens 11.

Further, the optical pickup device of the present invention can allow the semiconductor laser 1 and the relay lens 11 to be easily discerned and improve working efficiency in their positioning operations by applying the color 41 different from that of the casing of the semiconductor laser 1 on the circumferential surface of the semiconductor laser 1, and applying the color 42 different from the color 41 on the circumferential surface of the relay lens 11.

Further, in the optical pickup device according to the preferred embodiment of the present invention, the rectangular holes 32 are formed in both side surfaces of the housing 31. However, the holes 32 can be appropriately modified in their shapes, positions and numbers if necessary, and are not limited to this embodiment.

Further, in the optical pickup device of the embodiment of the present invention, the color 41 different from that of the casing of the semiconductor laser 1 is applied on the circumferential surface of the semiconductor laser 1, and the color 42 different from the color 41 is applied on the circumferential surface of the relay lens 11. However, marking can be used instead of the application of colors.

As described above, the present invention provides a light irradiating device, in which a secondary lens is disposed between a light emitting device and a lens system, and the light emitting device and the secondary lens can be independently moved along an optical axis to be fixed to arbitrary positions on the optical axis, thus enabling the light irradiating device to emit light having a light use efficiency and a uniform light intensity distribution required for recording/reproducing of an optical information recording medium.

Further, the light irradiating device of the present invention is advantageous in that it can prevent refraction and eccentricity of the optical axis, and allow its assembly and adjustment to be easily performed. Further, the light irradiating device can minimize generation of astigmatism, and adjust deviation of a radiation angle of emitted light.

Further, in the light irradiating device of the present invention, the lens system has a collimating lens for converting the light emitted from the light emitting device into parallel light, and an object lens for narrowing the parallel light from the collimating lens to a predetermined diameter, wherein the collimating lens can be fixed to an arbitrary position on the optical axis by moving the collimating lens along the optical axis, thus obtaining a light use efficiency and a uniform light intensity distribution required for recording/reproducing of an optical information recording medium, in an infinite optical system.

In the light irradiating device of the present invention, the light emitting device and the lens system are accommodated within a housing, and one or more holes to detect the position of the light emitting device or the lens system, or positions of both the light emitting device and the lens system, are formed in side surfaces of the housing, thereby allowing positioning operations of the light emitting device or the lens system, or both the light emitting device and the lens system, to be easily carried out in a short period of time.

In the light irradiating device, a discerning mark is formed on the light emitting device or the lens system, or both the light emitting device and the lens system, thus enabling the light emitting device or the lens system, or both the light emitting device and the lens system, to be easily discerned, and improving working efficiency in positioning operations.

An optical pickup device of the present invention includes the light irradiating device of the present invention and can emit light having a light use efficiency and a uniform light intensity distribution required for recording/reproducing of an optical information recording medium to the optical information recording medium.

A method of adjusting the light irradiating device of the present invention can enable emission of light having a light use efficiency and a uniform light intensity distribution required for recording/reproducing of an optical information recording medium by varying a composite focal distance of the lens system and the secondary lens by moving the secondary lens along an optical axis, and moving the light emitting device along the optical axis, and allowing a light emitting point of the light emitting device to correspond to a composite focus of the lens system and the secondary lens. Further, the secondary lens and the light emitting device can be moved along the optical axis, thus enabling the light irradiating device to be easily assembled and adjusted, and removing difficulty of assembly and adjustment of a conventional light irradiating device.

Another method of adjusting the light irradiating device of the present invention can enable emission of light having light use efficiency and a uniform light intensity distribution required for recording/reproducing of an optical information recording medium by varying a composite focal distance of the collimating lens and the secondary lens by moving the collimating lens and the secondary lens independently along an optical axis, thus allowing the position of a composite focus of the collimating lens and the secondary lens to correspond to a light emitting point of the light emitting device. Further, the collimating lens and the secondary lens can be moved along the optical axis, thus enabling the light irradiating device to be easily assembled and adjusted, and removing difficulty of assembly and adjustment of a conventional light irradiating device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A light irradiating device, comprising:
   a light emitting device;
   a lens system for narrowing light emitted from the light emitting device to a predetermined diameter; and
   a secondary lens disposed between the light emitting device and the lens system;
   wherein each of the light emitting device and the secondary lens is fixed to an arbitrary position on an optical axis while allowing the light emitting device and the secondary lens to move independently along the optical axis.

2. The light irradiating device according to claim 1, wherein the lens system includes a collimating lens for converting the light emitted from the light emitting device into parallel light, and an object lens for narrowing the parallel light from the collimating lens to a predetermined diameter; and
   the collimating lens is fixed to an arbitrary position on the optical axis while allowing the collimating lens to move along the optical axis.

3. The light irradiating device according to claim 2, further comprising a housing for accommodating the light emitting device and the lens system therein, the housing having one or more holes formed in side surfaces thereof for detecting a position of the light emitting device or the lens system, or positions of both the light emitting device and the lens system.

4. The light irradiating device according to claim 2, wherein at least one of the light emitting device and the lens system has a discerning mark formed thereon.

5. The light irradiating device according to claim 3, wherein at least one of the light emitting device and the lens system has a discerning mark formed thereon.

6. The light irradiating device according to claim 1, further comprising a housing for accommodating the light emitting device and the lens system therein, the housing having one or more holes formed in side surfaces thereof for detecting a position of the light emitting device or the lens system, or positions of both the light emitting device and the lens system.

7. The light irradiating device according to claim 6, wherein at least one of the light emitting device and the lens system has a discerning mark formed thereon.

8. The light irradiating device according to claim 1, wherein at least one of the light emitting device and the lens system has a discerning mark formed thereon.

9. An optical pickup device comprising:
   a light irradiating device, comprising,
      a light emitting device,
      a lens system for narrowing light emitted from the light emitting device to a predetermined diameter, and
      a secondary lens disposed between the light emitting device and the lens system,
      wherein each of the light emitting device and the secondary lens is fixed to an arbitrary position on an optical axis while allowing the light emitting device and the secondary lens to move independently along the optical axis.

10. The optical pickup device according to claim 9, wherein the lens system includes a collimating lens for converting the light emitted from the light emitting device into parallel light, and an object lens for narrowing the parallel light from the collimating lens to a predetermined diameter,
   wherein the collimating lens is fixed to an arbitrary position on the optical axis while allowing the collimating lens to move along the optical axis.

11. The optical pickup device according to claim 10, wherein the light irradiating device further comprises a housing for accomadating the light emitting device and the lens system therein, the housing having one or more holes formed in side surfaces thereof for detecting a position of the light emitting device or the lens system.

12. The optical pickup device according to claim 10, wherein at least one of the light emitting device and the lens system has a discerning mark formed thereon. or positions of both the light emitting device and the lens system.

13. The optical pickup device according to claim 9, wherein the light irradiating device further comprises a housing for accommodating the light emitting device and the lens system therein, the housing having one or more holes formed in side surfaces thereof for detecting a position of the light emitting device or the lens system, or positions of both the light emitting device and the lens system.

14. The optical pickup device according to claim 9, wherein at least one of the light emitting device and the lens system has a discerning mark formed thereon.

15. A method of adjusting a light irradiating device, the light irradiating device having a light emitting device, a lens system for narrowing light emitted from the light emitting device to a predetermined diameter, and a secondary lens disposed between the lens system and the light emitting device, comprising the steps of:
   varying a composite focal distance of the lens system and the secondary lens by moving the secondary lens along an optical axis; and
   moving the light emitting device along the optical axis, and allowing a light emitting point of the light emitting device to correspond to a composite focus of the lens system and the secondary lens.

16. A method of adjusting a light irradiating device, the light irradiating device having a light emitting device, a collimating lens for converting light emitted from the light emitting device into parallel light, an object lens for narrowing the parallel light from the collimating lens to a predetermined diameter and a secondary lens disposed between the collimating lens and the light emitting device, comprising the step of:
   varying a composite focal distance of the collimating lens and the secondary lens by moving the collimating lens and the secondary lens independently along an optical axis, thus allowing the position of a composite focus of the collimating lens and the secondary lens to correspond to a light emitting point of the light emitting device.

* * * * *